(12) United States Patent
Nawrocki (10) Patent No.: US 9,544,672 B2
(45) Date of Patent: Jan. 10, 2017

(54) CONDENSER MICROPHONE (71) Applicant: Piotr Nawrocki, Inowroclaw (PL)

(72) Inventor: Piotr Nawrocki, Inowroclaw (PL)

( * ) Notice: Subject to any disclaimer, the term of this patent is extended or adjusted under 35 U.S.C. 154(b) by 20 days.

(21) Appl. No.: 14/571,200

(22) Filed: Dec. 15, 2014

(65) Prior Publication Data
US 2016/0173967 A1    Jun. 16, 2016

(51) Int. Cl.
*H04R 19/04* (2006.01)
*H04R 1/04* (2006.01)
*H03F 3/181* (2006.01)
*H04R 7/04* (2006.01)

(52) U.S. Cl.
CPC ............ *H04R 1/04* (2013.01); *H03F 3/181* (2013.01); *H04R 7/04* (2013.01); *H04R 19/04* (2013.01); *H04R 2307/023* (2013.01)

(58) Field of Classification Search
CPC . H04R 2307/023; H04R 19/005; H04R 19/04; H04R 19/016; H04R 7/04; H04R 7/10; H04R 1/04; H04R 31/00; H04R 31/003;H04R 17/00; H04R 17/02; H04R 23/00; H04R 23/002
See application file for complete search history.

(56) References Cited

U.S. PATENT DOCUMENTS

| | | | |
|---|---|---|---|
| 2014/0247954 A1* | 9/2014 | Hall | H04R 17/02 381/92 |
| 2014/0270271 A1* | 9/2014 | Dehe | H04R 23/00 381/174 |
| 2015/0090043 A1* | 4/2015 | Ruhl | G01N 3/02 29/825 |
| 2015/0381078 A1* | 12/2015 | Massoner | H02N 1/006 310/300 |

FOREIGN PATENT DOCUMENTS

KR    WO 2011142637 A2 *  11/2011  ............. H04R 19/04

* cited by examiner

*Primary Examiner* — Thang Tran
(74) *Attorney, Agent, or Firm* — Masuvalley & Partners (57) ABSTRACT

Embodiments of the present invention provide a condenser microphone with a movable lining and a fixed lining. The movable lining and the fixed lining are respectively connected to a power supply and an amplifier. The movable lining includes graphene (G), formed at least as one graphene layer, while the fixed pad is formed as a fixed plate.

18 Claims, 7 Drawing Sheets

CONDENSER MICROPHONE

RELATED APPLICATIONS

The present invention claims priority to European Patent Application No. EP14460119.2 filed Dec. 10, 2014 entitled Mikrofon pojemnościowy, which is incorporated herein by reference in its entirety.

TECHNICAL FIELD

The present invention relates to condenser microphones with a moveable pad or membrane. More specifically, it relates to a condenser microphone with a membrane containing graphene G. The object of the invention is a condenser microphone, especially for use in studios, but also on the scene, as the central microphone for drums and to reinforce the sound of orchestras or choirs.

BACKGROUND OF THE DISCLOSURE

A microphone is an electroacoustic transducer changing the sound wave energy into electricity. The conversion of this energy may be performed in different ways (hence the different types of microphones). The microphone is typically the first element of an audio track. Microphones can be classified into different categories based on the following criteria:

the way of processing the membrane vibrations into an electrical signal;
the nature of the sound field effects on the membrane; and
the application itself.

In the first category, the way of processing vibrations of the membrane, the following categories may be further distinguished:

carbon microphone;
piezoelectric microphone;
dynamic microphone;
condenser microphone (electret/large-diaphragm/small-diaphragm/surface); and
experimental microphones.

Figure 1:
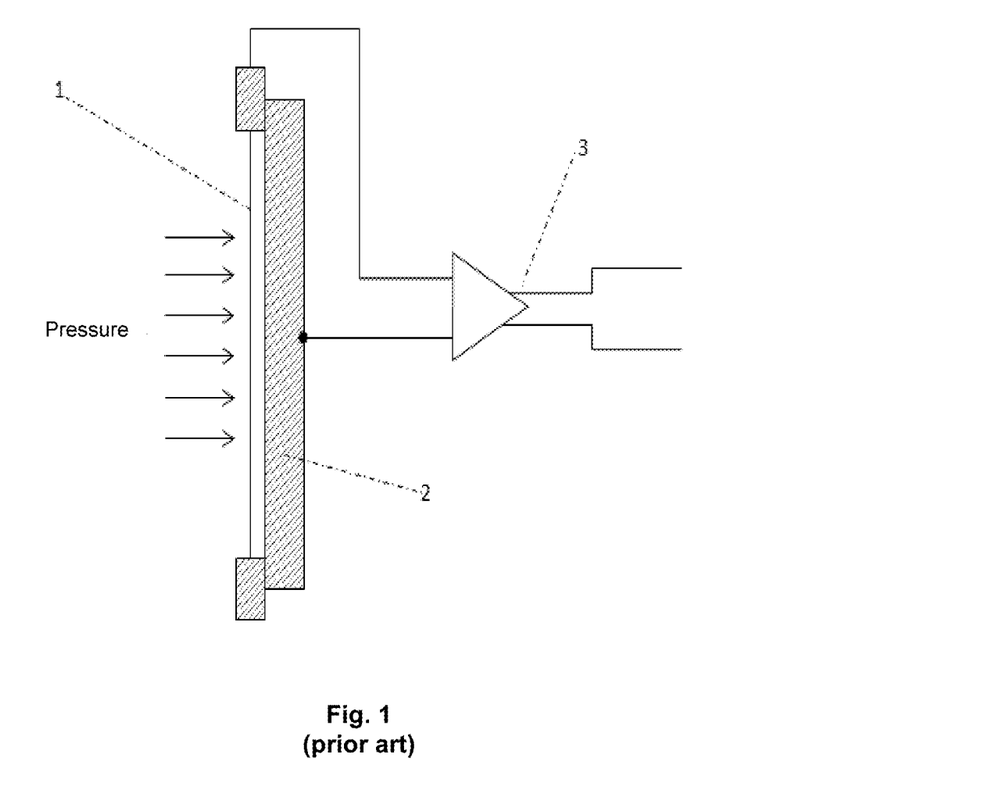
FIG. 1 illustrates a block diagram of a prior art condenser microphone.

The condenser microphone was first invented at Bell Labs in 1916. The structure consisted of two electrodes. One of the pads is stationary while the other pad acts as a diaphragm and is exposed to acoustic waves as shown in FIG. 1. Movement of the diaphragm creates a variable component in the DC voltage of the capacitor, which reflects the frequency of the acoustic wave incident on the microphone. For this design to work, the voltage of 48V is necessary (i.e. a phantom and it is provided with a battery or a microphone cable). Depending on whether the polarization requires an external microphone or not, the condenser microphones may be divided into externally polarized condenser microphone and electret microphones. Both types require power, as an integral part of the microphone, such as, for example, a three-microphone amplifier. In the following, the electret microphones and the externally polarized condenser microphones will be describe in detail.

In the case of making high quality recording of voice or sound of the choir (or any other group of people singing), i.e., strings or metal drums, a condenser microphone is used. This may happen for two reasons: these microphones have a generally wider and more even frequency range than dynamic microphones of comparable quality. Additionally, they do have a wider bandwidth and above all, have higher voltage sensitivity. Therefore, because of their sensitivity to loud noises, compared to dynamic microphones, they are used predominantly in the studios.

In the prior art publication CN103557929 (A) a method for making a membrane comprising graphene is disclosed. The produced membrane is then used as an element of the optical fiber system, which represent the acoustic pressure sensors. The publication KR101058475 (B1) discloses a MEMS microphone comprising a graphene diaphragm structure and a method of manufacture of graphene layers on the surface of the fixed electrode covered with polysilicone.

SUMMARY OF THE INVENTION

An object of the present invention is to provide a condenser microphone having a moveable pad and a fixed pad connected to the power supply and the amplifier. In accordance with one aspect of the present invention, the movable pad includes graphene, formed at least as one graphene layer, while the fixed pad is formed as a fixed plate.

According to one embodiment of the present invention, the graphene layer is present in doped form.

According to another embodiment, the movable pad or liner includes a layer of graphene and a layer of adhesive, where the graphene layer is in direct contact with the adhesive layer. Preferably, the adhesive layer is a polymer layer.

According to yet another embodiment, the movable pad comprises a layer of graphene and two layers of adhesive, where the graphene layer is disposed directly between the two layers of adhesive. Preferably, the graphene layer is a two-dimensional layer forming a single-layer or more of such layers.

According to yet another embodiment, the graphene layer is in the form of nanotubes, arranged substantially parallel to the surface of the movable pad or arranged substantially perpendicular to the surface of the movable pad. Preferably, the fixed pad is provided with grooves. Preferably, the movable pad is placed between two fixed pads. More preferably, from the movable pad to the fixed pad or the fixed pads, only the movable pad includes at least one layer of graphene.

BRIEF DESCRIPTION OF THE DRAWINGS

The present disclosure is described in conjunction with the appended figures.

In the appended figures, similar components and/or features may have the same reference label. In the following detailed description of the preferred embodiment(s), the main structural elements are respectively indicated by the following reference numerals: 1—movable pad or membrane, 2—fixed pad, 3—power supply and amplifier, G—graphene, DG—doped graphene, and P—polymer.

DETAILED DESCRIPTION OF THE INVENTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment(s) of the disclosure. It should be understood that various changes may be made in the function and arrangement of elements without departing from the spirit and scope of the invention as set forth in the appended claims.

This disclosure relates in general to condenser microphones and their use in studios or on the scenes. More specifically, it relates to condenser microphones having a movable pad containing graphene (G).

The first component of the movable pad or membrane 1 is graphene (G), which is formed as a monatomic conductive layer. This conductive layer has all the required properties for production of a movable pad 1 in a condenser microphone, including:

very good electrical conductivity,
strength,
a structure of monatomic thickness.

The second component of the movable pad 1 is an adhesive of any polymer which ensures consistency, hardness, flexibility and resistance to compression of the movable pad 1.

The structure of the movable pad 1 of a condenser microphone takes into account:

applying more layers of graphene (G) in the movable pad 1, thus allowing for changes in the characteristics of the microphone.

the use of graphene (G) in the form of nanotubes, if the use of the properties of graphene (G), which are given by such construction are necessary to increase the effectiveness of the membrane.

doping of graphene (G) to modify some properties of the material, e.g.: electrical, or mechanical The movable pad 1 of a condenser microphone according to the embodiments of the invention is characterized by a structure selected from the following:

graphene (G) layer (two-dimensional or nanotubes structure), a layer of graphene (G) (two-dimensional or of nanotubes structure) between the two polymer layers with contact leads 5 to the surface of one of the two polymer layers, a layer of graphene (G) (two-dimensional or of nanotubes structure)"embedded" on the surface of a single layer of polymer, doped graphene (DG) layer (two-dimensional or of nanotubes structure)

a doped layer of graphene (DG) (two-dimensional or of nanotubes structure) between the two polymer layers with contact leads 5 to the surface of one of the two polymer layers, a doped layer of graphene (DG) (two-dimensional or of nanotubes structure) "embedded" on the surface of a single layer of polymer.

By way of example, in the above-described embodiments, the graphene (G) layer may be formed as a two-dimensional layer forming a monatomic layer or several of such layers, or formed as nanotubes structures arranged in a way that they form a single layer structure, or are arranged perpendicular to the surface of the movable pad 1 forming a three-dimensional layer.

The movable pad 1 according to the embodiments of the present invention, is light due to the use of graphene (G), which ensures accurate reproduction of high frequencies. Additionally, the high strength of graphene (G) also allows for creation of relatively large membranes, making it possible to play high quality bass sound. Moreover, a light membrane requires little power to operate. Therefore, the use of graphene (G) membranes in capacitive microphones allows for increasing quality characteristics.

Figure 7:
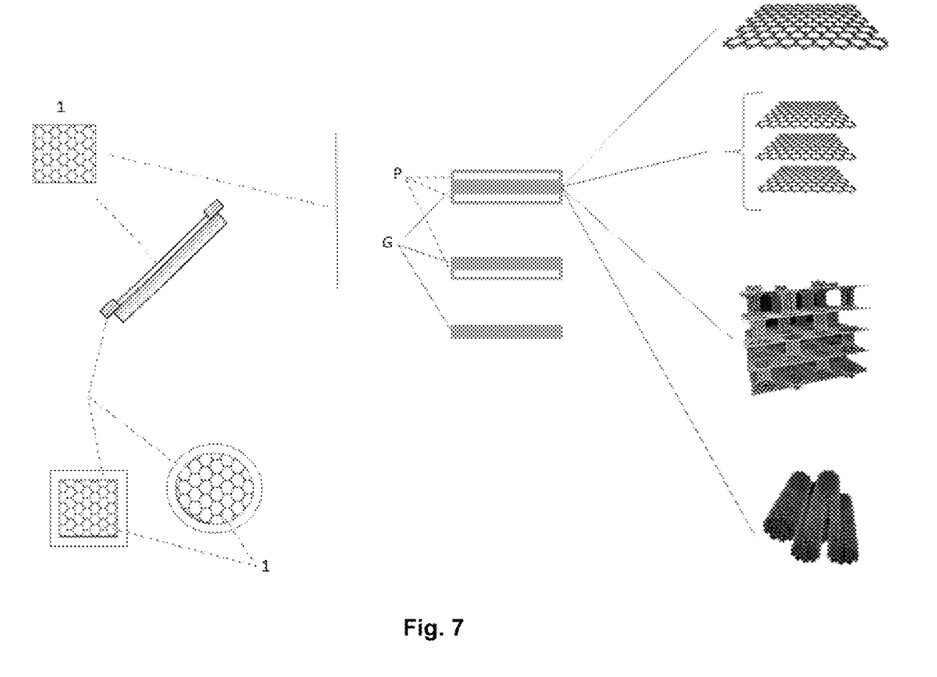
FIG. 7 is a schematic illustration of example structures of a movable pad in a capacitor microphone.

A graphene layer may be used in different configurations of condenser microphones according to the embodiments of the present invention. Depending on the design, arrangement of graphene (G) in the structure of the movable pad 1 may take any form capable of producing the most favorable characteristics. Examples of alignment of the movable pad structures 1 are illustrated in FIG. 7.

Example 1

A Condenser Microphone of the Present Invention

Figure 2:
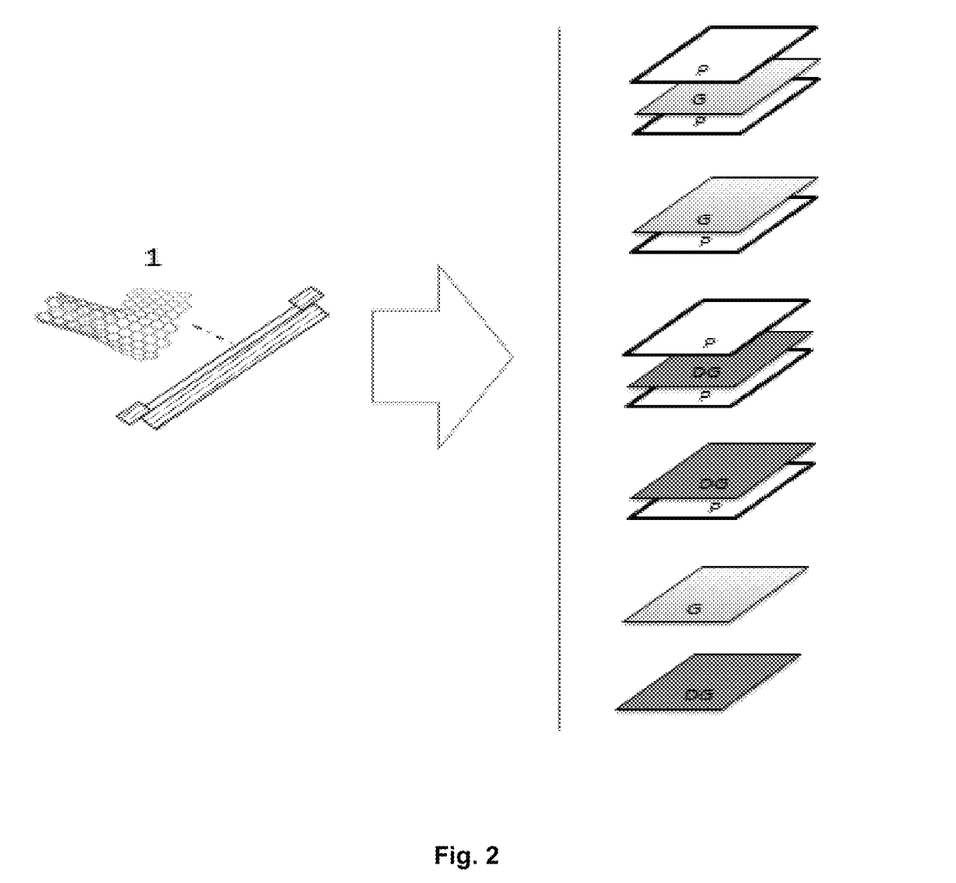
FIG. 2 illustrates a block diagram of an embodiment of a movable pad in a capacitor microphone.
Figure 3:
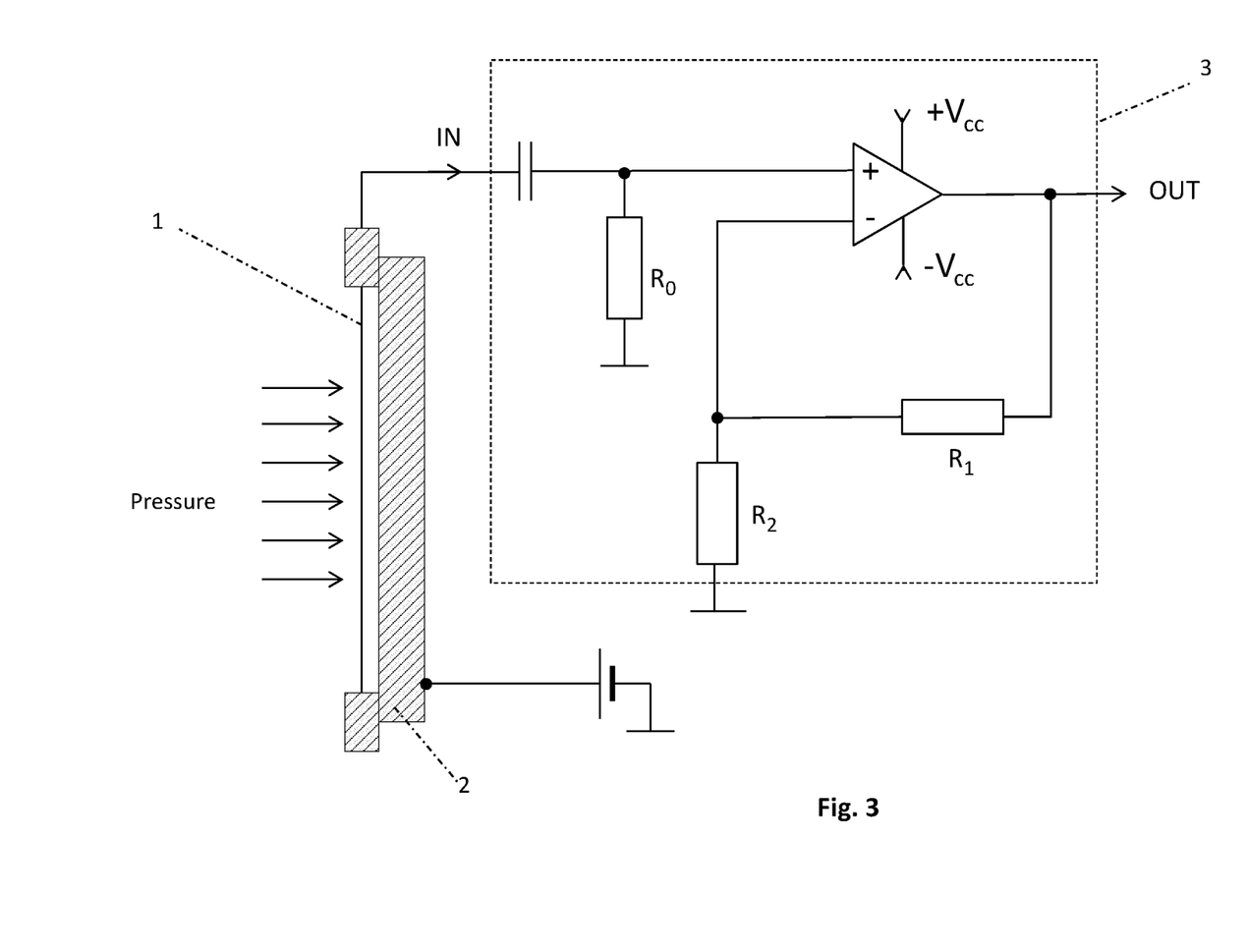
FIG. 3 illustrates a schematic diagram of a movable pad containing graphene in a condenser microphone with a power supply and amplifier.

In the present embodiment, the condenser microphone as shown in FIG. 3, has a light moveable pad 1 (the membrane) of graphene (G) which is built in the form of a capacitor. The second pad, i.e. the fixed pad 2 is a stationary plate. The flexible material of the movable pad 1 has a structure composed of two components having different characteristics: monatomic layer of graphene G and a layer of adhesive, such as, for example, a polymer P, forming a 2-layer structure G/P, as illustrated in FIG. 2. The properties of the composites are neither the sum nor the average of the properties of its components, and the material 3 used exhibits anisotropy of physical properties of both materials in its construction. Use of the polymer P further provides consistency and elasticity of the movable pad 1.

Example 2

Application of Graphene Layers in a Microphone with External Power Supply—Phantom In this embodiment, the condenser microphone as shown in FIG. 3 is constructed in a way that the movable pad 1 and the fixed pad 2 are connected via a high resistance resistor $R_o$ to a power supply and amplifier 3, providing a source of bias voltage. This resistor has a dual role here: in a standby mode, when no sound wave falls on the moveable pad 1, it prevents the discharge of the capacitor, and when sound wave falls on the microphone, the movable pad 1 moves under the sound pressure on the surface and vibrates around the standby position. In this way, the capacity of pad 1 changes, the charging (and discharging power) flows through the resistor, and variable voltage drop is formed between the resistor terminals. Thus, the pad 1 itself may be seen as a source of electromotive force. The greater the amplitude of excursion of the movable pad 1 relative to the distance to the fixed pad 2, the greater is the bias voltage.

Example 3

Figure 4:
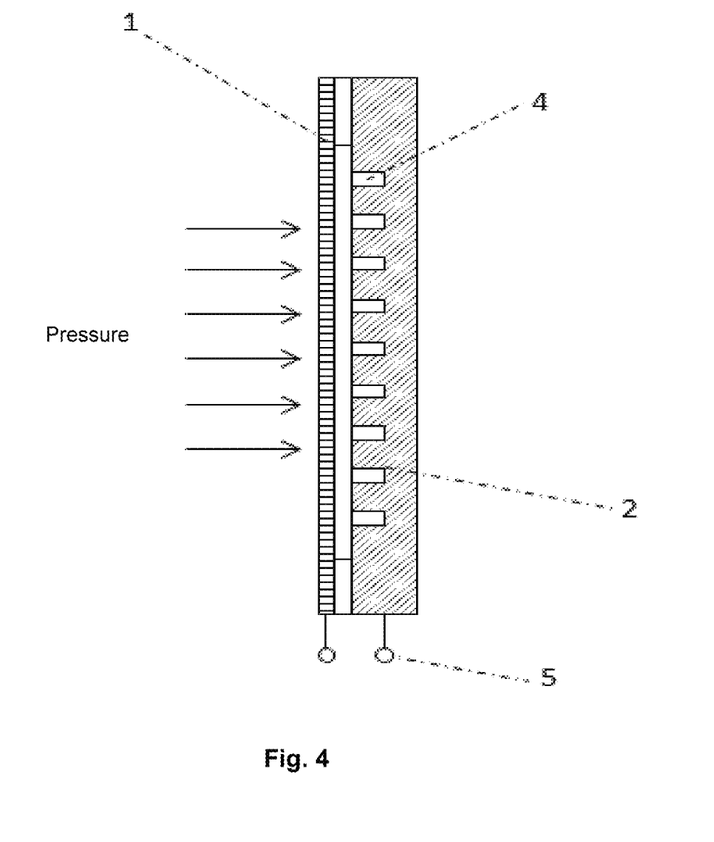
FIG. 4 illustrates a schematic diagram of a movable pad containing graphene in an alternative embodiment of a condenser microphone (omnidirectional).

The Application of the Graphene Layer in an Omnidirectional Condenser Microphone In the present embodiment, the omnidirectional condenser microphone, as shown in FIG. 4, is constructed in a way that the movable pad 1 is adjacent to the fixed pad 2, which is in the form of a flat plate with grooves 4 (drillings). The grooves 4 are meant to increase the susceptibility of the space between the pads and further to reduce the frictional resistance of air on the pads. In order to obtain a large deflection of the membrane, and therefore high efficiency, the susceptibility of the system is high. This effect is achieved with the smallest possible weight of the movable pad 1. The shape of the cap is important for the course of the characteristics of the level of effectiveness (in the case of a small-membrane microphone) and the capsule (so called pitch of the capsule in the case of large-membrane microphones) and the shape and size of openings in the cap or capsule. By proper selection of these parameters the deficiencies in performance characteristics can be compensated for. It should be noted that the characteristics of the directivity of the microphone is also associated with the size of the microphone.

Example 4

Figure 5:
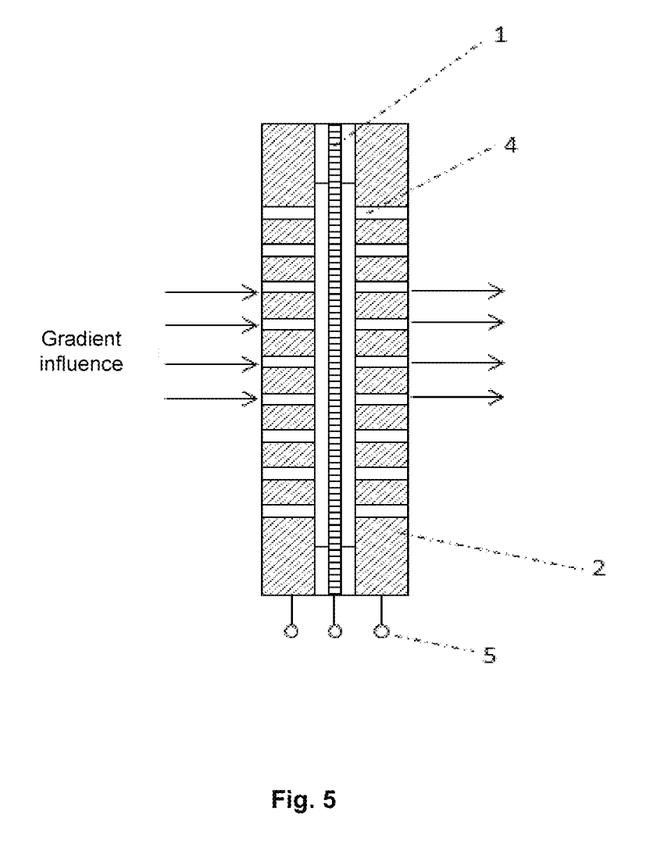
FIG. 5 illustrates a schematic diagram of a movable pad containing graphene in an alternative embodiment of a condenser microphone (bi-directional).

The Application of the Graphene Layer in a Bi-Directional Condenser Microphone In this embodiment, the bi-directional condenser microphone as illustrated in FIG. 5, has an octal characteristic, and the movable pad 1 is disposed between the two fixed pads 2, having a plurality of openings connecting the space surrounding the moveable pad 1 with the atmosphere. Upon incidence of acoustic waves perpendicular to the moveable pad 1, the pressure differential is the greatest and upon the tangential incidence—zero. A condenser microphone of octal characteristics, arranged at a short distance from the source enhances low frequencies and to eliminate the impact of this phenomenon correction must be applied to undercut slightly the bottom of the band.

Example 5

Figure 6:
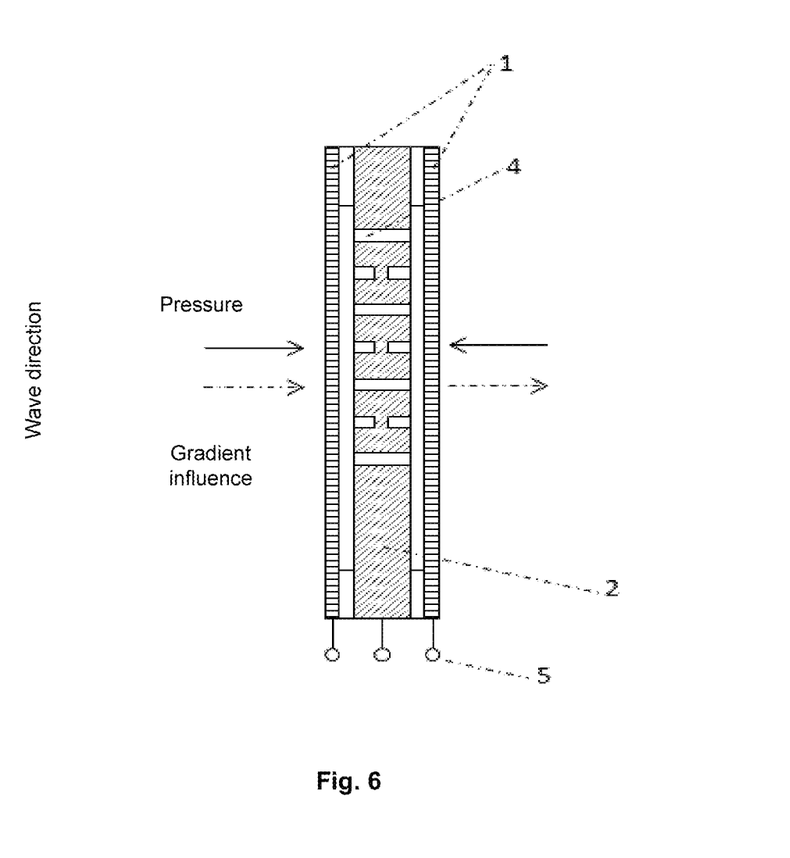
FIG. 6 illustrates a schematic diagram of a movable pad containing graphene in an alternative embodiment of a condenser microphone (unidirectional).

The Application of the Graphene Layer in a Unidirectional Condenser Microphone In the present embodiment, the unidirectional condenser microphone, as illustrated in FIG. 6, includes two movable pads 1 which are disposed on both sides of the fixed pad 2, having a series of grooves 4. Please note that only one of the movable pads 1 is electrically open. When an acoustic wave falls on the microphone, both moving pads 1 are subjected to forces which are derived from the sound pressure and the pressure gradient. The forces derived from the sound pressure work on the movable pads 1 in opposite directions, trying to move them closer or further of each other. The forces derived from the pressure gradient move both movable pads 1 in the same direction. In this way the forces derived from the pressure gradient and the sound pressure operate the moveable pads 1 facing the wave in the same direction are added up, and thus, the opposite movable pads 1 in the opposite directions are subtracted.

While the principles of the disclosure have been described above in connection with specific apparatuses, it is to be clearly understood that this description is made only by way of example and not as limitation on the scope of the invention.

What is claimed is:

1. A condenser microphone comprising a movable pad and a fixed pad formed as a fixed plate and connected to a power supply and an amplifier, wherein the pads form a capacitor in which the fixed pad is stationary and the movable pad is suitable for acting as a diaphragm while exposed to acoustic waves, wherein the movable pad comprises a graphene layer and a first adhesive layer, and wherein the graphene layer is in direct contact with the first adhesive layer.

2. The condenser microphone according to claim 1, wherein the graphene is a doped graphene.

3. The condenser microphone according to claim 1, wherein the first adhesive layer is a polymer layer.

4. The condenser microphone according to claim 1, wherein the graphene layer is a two-dimensional layer forming a single-layer or more of such layers.

5. The condenser microphone according to claim 1, wherein the graphene layer is carbon nanotubes arranged substantially parallel to the surface of the movable pad and arranged substantially perpendicular to the surface of the movable pad.

6. The condenser microphone according to claim 1, wherein the movable pad further comprises a second adhesive layer, and wherein the graphene layer is disposed between the first and second adhesive layers.

7. The condenser microphone according to claim 6, wherein the second adhesive layer is polymer layer.

8. The condenser microphone according to claim 6, wherein the graphene layer is a two-dimensional layer forming a single-layer or more of such layers.

9. The condenser microphone according to claim 6, wherein the graphene layer is carbon nanotubes arranged substantially parallel to the surface of the movable pad and arranged substantially perpendicular to the surface of the movable pad.

10. A condenser microphone comprising a movable pad and two fixed pads connected to a power supply and an amplifier, wherein the movable pad comprises graphene formed at least as one layer and the two fixed pad are formed as fixed plates comprising grooves, and wherein the movable pad is disposed between the two fixed pads and comprises a graphene layer and a first adhesive layer, and wherein the graphene layer is in direct contact with the first adhesive layer.

11. The condenser microphone according to claim 10, wherein the first adhesive layer is a polymer layer.

12. The condenser microphone according to claim 10, wherein the graphene layer is a two-dimensional layer forming a single-layer or more of such layers.

13. The condenser microphone according to claim 10, wherein the graphene layer is carbon nanotubes arranged substantially parallel to the surface of the movable pad and arranged substantially perpendicular to the surface of the movable pad.

14. The condenser microphone according to claim 10, wherein the movable pad further comprises a second adhesive layer, and wherein the graphene layer is disposed between the first and second adhesive layers.

15. The condenser microphone according to claim 14, wherein the second adhesive layer is polymer layer.

16. The condenser microphone according to claim 14, wherein the graphene layer is a two-dimensional layer forming a single-layer or more of such layers.

17. The condenser microphone according to claim 14, wherein the graphene layer is carbon nanotubes arranged substantially parallel to the surface of the movable pad and arranged substantially perpendicular to the surface of the movable pad.

18. The condenser microphone according to claim 10, wherein the graphene is a doped graphene.

\* \* \* \* \*